(12) United States Patent
Tomohiro

(10) Patent No.: US 9,093,281 B2
(45) Date of Patent: Jul. 28, 2015

(54) LUMINESCENCE DEVICE

(71) Applicant: LG INNOTEK CO., LTD., Seoul (KR)

(72) Inventor: Sampei Tomohiro, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/014,777

(22) Filed: Aug. 30, 2013

(65) Prior Publication Data

US 2014/0091345 A1    Apr. 3, 2014

(30) Foreign Application Priority Data

Sep. 28, 2012  (KR) .................. 10-2012-0108580

(51) Int. Cl.
| | | |
|---|---|---|
| H01L 23/00 | (2006.01) | |
| H01L 33/62 | (2010.01) | |
| H01L 33/38 | (2010.01) | |
| H01L 33/50 | (2010.01) | |
| H01L 33/64 | (2010.01) | |

(52) U.S. Cl.
CPC ................ *H01L 24/04* (2013.01); *H01L 24/02* (2013.01); *H01L 24/06* (2013.01); *H01L 33/382* (2013.01); *H01L 33/50* (2013.01); *H01L 33/62* (2013.01); *H01L 33/647* (2013.01); *H01L 2224/48091* (2013.01)

(58) Field of Classification Search
CPC .......... H01L 2224/73265; H01L 2224/48227; H01L 2224/48247; H01L 33/62; H01L 24/48
USPC ............ 257/88, 99, 100, 667, 687, 723, 739, 257/753, 779, 784, 786, 787, E23.141, 257/E23.181, E23.02
See application file for complete search history.

(56) References Cited

U.S. PATENT DOCUMENTS

| | | | |
|---|---|---|---|
| 6,579,734 B2* | 6/2003 | Aoki .............................. 438/15 |
| 8,138,509 B2* | 3/2012 | Lin et al. ......................... 257/88 |
| 2003/0097452 A1* | 5/2003 | Kim et al. ..................... 709/229 |
| 2003/0136968 A1* | 7/2003 | Fjelstad ......................... 257/82 |
| 2009/0190009 A1* | 7/2009 | Kawasaki ..................... 348/249 |
| 2011/0089805 A1* | 4/2011 | Betsuda et al. ................ 313/46 |
| 2011/0133220 A1* | 6/2011 | Kim et al. ...................... 257/88 |
| 2014/0042467 A1* | 2/2014 | Livesay et al. ................. 257/88 |

* cited by examiner

*Primary Examiner* — Eduardo A Rodela
(74) *Attorney, Agent, or Firm* — KED & Associates, LLP

(57) ABSTRACT

A luminescence device used in a backlight unit for lighting or displaying may include a substrate having a first electrode and a second electrode, and an LED chip disposed on the first electrode. A dam is disposed on the substrate. The dam is disposed spaced from the LED chip, and the substrate comprises a direct copper bonding (DCB) substrate including a first copper layer and a second copper layer. The first electrode and the second electrode include respectively a metal film which fills a void of the surfaces thereof.

19 Claims, 4 Drawing Sheets

LUMINESCENCE DEVICE

CROSS-REFERENCE TO RELATED APPLICATION

The present application claims priority under 35 U.S.C. §119(e) of Korean Patent Application No. 10-2012-0108580 filed on Sep. 28, 2012, which is hereby incorporated by reference in its entirety.

BACKGROUND

1. Field

This embodiment relates to a luminescence device used in a backlight unit for lighting or displaying.

2. Description of Related Art

Here, related arts to this embodiment will be provided and has not necessarily been publicly known.

A light emitting device (LED) is a semiconductor device for converting electric energy into light. As compared with an existing light source, for example, a fluorescent lamp, an incandescent lamp and the like, the LED has low power consumption, a semi-permanent lifespan, a rapid response speed, safety, environmental friendliness. For these reasons, many researches are devoted to substitution of the existing light sources with the LED. The LED is now increasingly used as a light source for lighting devices, for example, various lamps used interiorly and exteriorly, a liquid crystal display device, an electric sign and a street lamp and the like.

Generally, a luminescence device using the LED includes two electrode patterns which is disposed on a substrate, a mold housing which receives a portion of the electrode pattern in the inside thereof and is injection-molded such that a cavity is formed to function as a filling space of a light transmitter, a heat sink layer which is disposed on the electrode pattern in the cavity, an LED chip which is disposed on the heat sink layer, and a bonding wire which electrically connects the electrode pattern and the LED chip. Here, the light transmitter seals the LED chip by filling the cavity. Depending on the color of the LED chip to be implemented, the light transmitter may include a phosphor or may be formed of a transparent resin.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Figure 1:
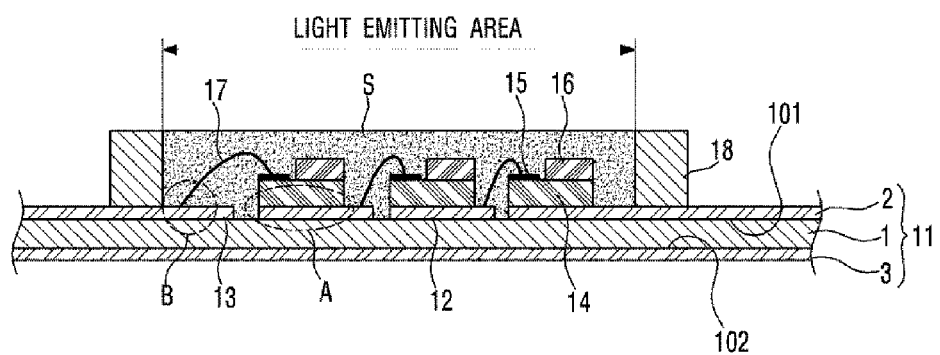
FIG. 1 is a cross sectional view of a luminescence device according to a first embodiment.

FIG. 1 is a cross sectional view of a luminescence device according to a first embodiment. With reference to FIG. 1, the structure of the luminescence device according to the first embodiment will be described.

As shown in FIG. 1, the luminescence device according to the first embodiment may include a direct copper bonding (DCB) substrate 11, an LED chip 14, a phosphor 16, a bonding wire 17, a dam 18 and an encapsulation layer "S".

The DCB substrate 11 may include a substrate body 1, a first copper layer 2 and a second copper layer 3.

The substrate body 1 may be formed of at least any one of a ceramic material, a polymer material, a resin material, a silicon material and the like or by any combination of them and may have a front side 101 and a rear side 102 facing the front side 101. The front side 101 and the rear side 102 form the outer surface of the substrate body 1 respectively. If an outer surface of the substrate body 1 is the front side 101, the other outer surface facing the front side 101 may be the rear side 102.

Besides the above-mentioned material of the substrate body 1, any material capable of functioning as an insulation layer and a body of the DCB substrate 11 can be used as the material of the substrate body 1. For example, $Al_2O_3$, ALN, BeO and the like may be used as the material of the substrate body 1.

The first copper layer 2 may be disposed on the front side of the substrate body 1. The second copper layer 3 may be disposed on the rear side of the substrate body 1. An electrode pattern may be formed on the first copper layer 2 by masketching a certain circuit pattern. Therefore, the first copper layer 2 may include a plurality of the electrode patterns. Here, the plurality of the electrode patterns may be a first electrode pattern 12 and a second electrode pattern 13.

The substrate body 1 may have a thickness of 0.2 to 0.32 mm. Also, the first copper layer 2 and the second copper layer 3 may have a thickness of 0.15 to 0.25 mm respectively. Also, the electrode patterns may be formed to electrically isolated from each other in consideration of heat radiation of the LED chip 14 or junction of the LED chip 14. The electrode patterns may be separated from each other by a distance within a range of 0.25 to 0.4 mm.

A driving circuit (not shown) for driving the LED chip 14 may be mounted. The driving circuit (not shown) may function to drive the LED chip 14 so as to perform functions according to the purpose and use of the luminescence device.

The DCB substrate 11 is a thermally conductive substrate. The DCB substrate 11 may radiate to the outside the heat generated from the LED chip 14. For the purpose of performing the function, the DCB substrate 11 may include the first and the second copper layers 2 and 3.

Although the first and the second copper layers 2 and 3 are shown in the embodiment, it is also allowed that the first and the second copper layers 2 and 3 are formed of another metal layer. For example, the first and the second copper layers 2 and 3 may be formed of a metal layer formed of at least any one selected from the group consisting of Ag, Au, Ni, Al, Cr, Ru, Re, Pb, Sn, In, Zn, Pt, Mo, Ti, Ta, W, etc., or may be formed of an alloy layer formed of the above-described metallic materials The first and second electrode patterns 12 and 13 may be comprised of electrodes for electrically connecting to the LED chip 14. Also, the first and second electrode patterns 12 and 13 may be patterned in such a manner as to be electrically connected to the driving circuit for driving the LED chip 14. The first and second electrode patterns 12 and 13 may perform a function of an electric wire connecting the components within the luminescence device. Therefore, the first and second electrode patterns 12 and 13 may be composed of an anode electrode and a cathode electrode for driving the LED chip 14. The LED chip 14 may be mounted on the first electrode pattern 12, and the second electrode pattern 13 may be electrically connected to an electrode pad 15 of the LED chip 14.

The LED chip 14 is a kind of light emitting means to emit light. The LED chip 14 may be one of a colored LED chip and an UV LED chip. The colored LED chip may be formed in the form of a package obtained by combining at least one or more of a blue LED chip, a red LED chip, a green LED chip, a yellow green LED chip and a white LED chip. At least one LED chip 14 is mounted in a certain area of the DCB substrate 11, so that the area in which the LED chips 14 are mounted is a light emitting area. More specifically, the LED chip 14 may be mounted in a certain area on the first electrode pattern 12 of the DCB substrate 11.

Figure 2:
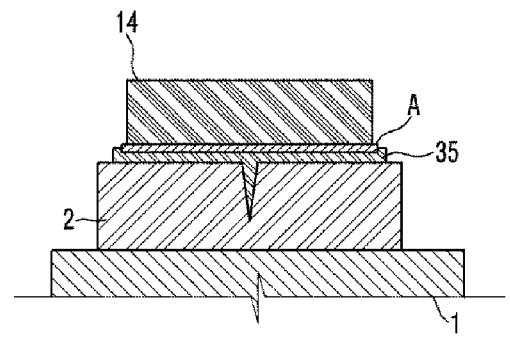
FIG. 2 is a cross sectional view showing an enlarged part denoted by 'A' of FIG. 1.

FIG. 2 is a cross sectional view showing an enlarged part denoted by 'A' of FIG. 1. Hereafter, the structure of the part denoted by "A" will be described with reference to FIG. 2.

As shown in FIG. 2, the LED chip 14 may be mounted such that a metal film 35 formed on the first electrode pattern 12 and an adhesive "A" applied on the metal film 35 are interposed between the first copper layer 2 and the LED chip 14. Here, the metal film 35 may be made of Ag, Au and the like, and the adhesive "A" may be made of AuSn and the like. However, the materials of the metal film 35 and the adhesive "A" are not limited to this.

The metal film 35 may be formed only on the portion on which the LED chip 14 is mounted. Due to the metal film 35, a mounting force between the first electrode pattern 12 and the LED chip 14 may be improved.

Figure 3A:
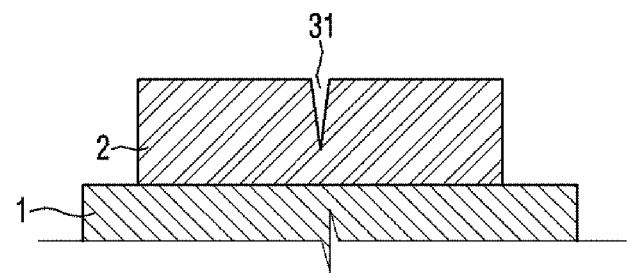
FIGS. 3a to 3c are cross sectional views for describing a method for forming a metal film of a DCB substrate of FIG. 1.

As shown in FIG. 3a, a plurality of voids 31 may be formed in the surface of the first copper layer 2 including the first electrode pattern 12 by grain boundary of the first copper layer 2. Due to the void 31, the mounting force between the first electrode pattern 12 and the LED chip 14 may be reduced. However, since the void 31 is filled with the metal film 35 by forming the metal film 35 on the first copper layer 2, the mounting force between the first electrode pattern 12 and the LED chip 14 may be enhanced by the metal film 35.

Figure 3B:
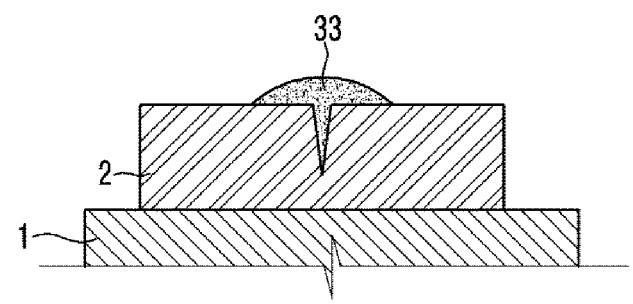
Figure 3C:
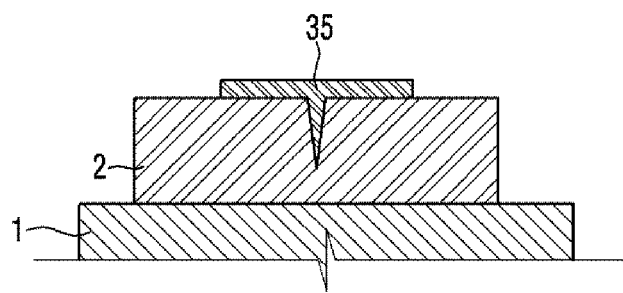

FIGS. 3a to 3c are cross sectional views for describing a method for forming the metal film of the DCB substrate of FIG. 1.

Hereafter, a method for forming the metal film 35 will be described with reference to FIGS. 3a to 3c.

As shown in FIG. 3a, a plurality of the voids 31 may be formed in the surface of the first copper layer 2 by grain boundary of the first copper layer 2.

As shown in FIG. 3b, a metal paste 33 may be applied on the surface of the first copper layer 2 in which the void 31 has been positioned. Here, the metal paste 33 may be applied on the portion on which the LED chip 14 is mounted and on the portion to which the bonding wire 17 is bonded.

As shown in FIG. 3c, the metal paste 31 is sequentially dried, fired and flattened. Then, the metal film 35 which fills the void 31 may be positioned on the surface of the first copper layer 2.

Here, an anti-corrosion layer (not shown) for preventing copper from being corroded may be further positioned on the surface having no metal film 35 disposed thereon of the first copper layer 2.

Also, the LED chip 14 may include the electrode pad 15. The electrode pad 15 may be disposed in a predetermined area of the top surface of the LED chip 14 in a direction in which the second electrode pattern 13 is disposed.

Continuously, the bonding wire 17 may be bonded to the second electrode pattern 13 and the electrode pad 15 of the LED chip 14 mounted on the first electrode pattern 12 respectively. Thus, the second electrode pattern 13 and the electrode pad 15 of the LED chip 14 mounted on the first electrode pattern 12 may be electrically connected to each other through the bonding wire 17. The bonding wire 17 may be formed of a material having an excellent electrical conductivity, e.g., Au, Ag and the like.

Figure 4:
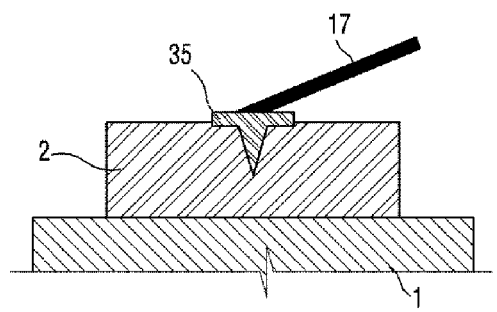
FIG. 4 is a cross sectional view showing an enlarged part denoted by 'B' of FIG. 1.

FIG. 4 is a cross sectional view showing an enlarged part denoted by 'B' of FIG. 1.

In a case where the second electrode pattern 13 is bonded to the bonding wire 17, the bonding wire 17 may be, as shown in FIG. 4, bonded to the metal film 35 disposed on the second electrode pattern 13.

The metal film 35 is disposed only on the portion to which the bonding wire 17 is bonded. Thus, the metal film 35 is able to improve the bonding force between the second electrode pattern 13 and the bonding wire 17. That is, as shown in FIG. 3a, a plurality of voids 31 may be disposed in the surface of the first copper layer 2 including the second electrode pattern 13 by grain boundary of the first copper layer 2. Due to the void 31, the bonding force between the second electrode pattern 13 and the bonding wire 17 may be reduced. However, since the void 31 is filled with the metal film 35, the bonding force between the second electrode pattern 13 and the bonding wire 17 may be enhanced by the metal film 35. Since a method for forming the metal film 35 is the same as the aforementioned method, a detailed description thereof will be omitted.

The phosphor 16 may be disposed adjacent to the electrode pad 15 on the LED chip 14. Here, the phosphor 16 may include at least one kind of the phosphor.

The phosphor 16 may function to excite light emitted from the LED chip 14. For example, the phosphor 16 may include at least one of a silicate based phosphor, a sulfide based phosphor, a YAG based phosphor, a TAG based phosphor and a nitride based phosphor.

The dam 18 is made of an insulation material. The dam 18 may be disposed on the DCB substrate 11 outside the first and the second electrode patterns 12 and 13. The dam 18 may be formed taller than the LED chip 14. The dam 18 may have a variety of shapes. For example, the dam 18 may have any one of shapes of a hemisphere, a semi-ellipse, a semi-circle, a quadrangle and a quadrangle having an upper chamfered edge.

The encapsulation layer "S" may be disposed over the first and the second electrode patterns 12 and 13. That is, the encapsulation layer "S" may be positioned in a space formed by the dams 18 and the first and the second electrode patterns 12 and 13. The encapsulation layer "S" may include a light-transmitting protective resin. For example, the encapsulation layer "S" may include a silicone resin or an epoxy resin, each of which includes a phosphor.

Reference light generated from the LED chip 14 may travel upward. In a portion adjacent to the surface of the LED chip 14, the reference light may be mixed with secondary excited light which is absorbed by the phosphor injected into the encapsulation layer "S" and is re-emitted. Accordingly, the reference light may be represented by a white color. Here, since the deviation and uniformity difference of the color are caused depending on the shape of the encapsulation layer "S" into which the phosphor has been injected, the encapsulation layer "S" may be formed flat.

As described above, since the luminescence device according to the first embodiment includes the DCB substrate 11 and the LED chip 14 mounted on the DCB substrate 11, the LED chip 14 is directly mounted on the DCB substrate 11 without both the electrode pattern disposed separately from the substrate and the heat sink layer disposed on the electrode pattern, so that the height of the luminescence device can be reduced.

Also, in the luminescence device, the metal film 35 is disposed to fill the void 31 which has been positioned in the surface of the first electrode pattern 12, on which the LED chip 14 is mounted, and in the surface of the second electrode pattern 13, to which the bonding wire 17 connected to the electrode pattern 15 is bonded. Accordingly, it is possible to improve the mounting force between the first electrode pattern 12 and the LED chip 14 and to improve the bonding force between the second electrode pattern 13 and the bonding wire 17.

Figure 5:
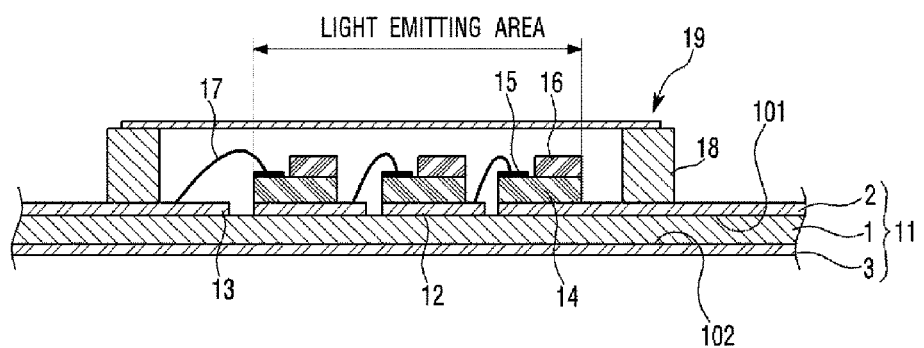
FIG. 5 is a cross sectional view of a luminescence device according to a second embodiment.

FIG. 5 is a cross sectional view of a luminescence device according to a second embodiment.

Referring to FIG. 5, the luminescence device according to the second embodiment may include the DCB substrate 11, the LED chip 14, the phosphor 16, the bonding wire 17, the dam 18 and a reflection preventing glass 19.

Since the configuration of the substrate 11, the LED chip 14, the bonding wire 17 and the dam 18 is the same as that of the foregoing first embodiment, a detailed description thereof will be omitted. Also, the metal film 35 formed to fill the void 31 which has been disposed in the surface of the first electrode pattern 12, on which the LED chip 14 is mounted, and in the surface of the second electrode pattern 13, to which the bonding wire 17 connected to the electrode pattern 15 is bonded is the same as that of the foregoing first embodiment. Therefore, a detailed description thereof will be omitted as well.

The phosphor 16 may be disposed adjacent to the electrode pad 15 on the LED chip 14. Here, the phosphor 16 may include at least one kind of the phosphor.

The phosphor 16 may function to excite light emitted from the LED chip 14. For example, the phosphor 16 may include at least one of a silicate based phosphor, a sulfide based phosphor, a YAG based phosphor, a TAG based phosphor and a nitride based phosphor.

Different kinds and amounts of the phosphors 16 may be included in accordance with the LED chip 14. For example, when the LED chip 14 emits white light, the phosphor 16 may include a green phosphor and a red phosphor. Further, when the LED chip 14 emits blue light, the phosphor 16 may include a green phosphor, a yellow phosphor and a red phosphor.

The reflection preventing glass 19 may be disposed above the first and the second electrode patterns 12 and 13 and on the dam 18 in parallel with the DCB substrate 11. The reflection preventing glass 19 may be spaced from the phosphor 16. A film may be used as the reflection preventing glass 19.

The reflectance of the reflection preventing glass 19 is less than that of a resin. Therefore, the reflection preventing glass 19 is able to reduce a light emitting area by suppressing light diffusion. For instance, the light emitting area for 30 LED chips 14 may be 140 mm$^2$.

Figure 6:
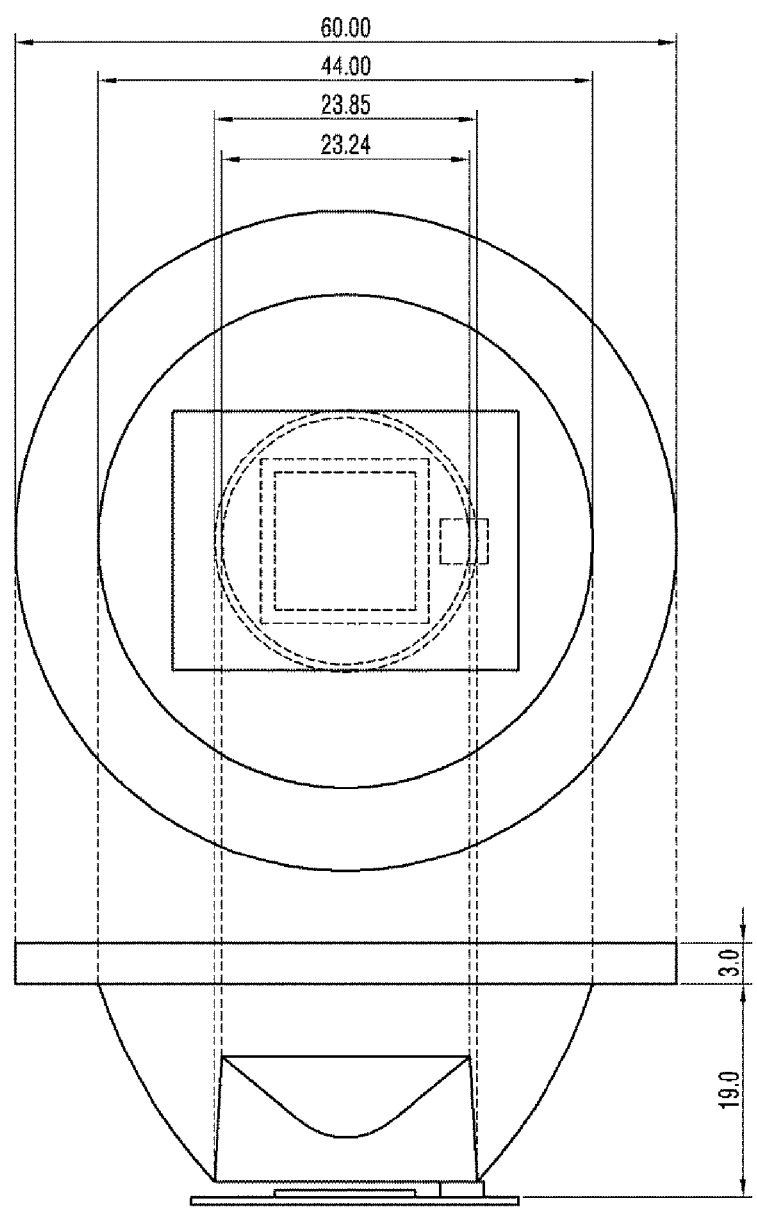
FIG. 6 is a schematic view showing a luminescence device in which an LED chip and a lens of FIG. 5 are coupled to each other.

FIG. 6 is a schematic view showing a luminescence device in which an LED chip and a lens of FIG. 5 are coupled to each other.

As described above, since the luminescence device according to the second embodiment includes the DCB substrate 11 and the LED chip 14 mounted on the DCB substrate 11, the luminescence device may not include the electrode pattern disposed separately from the substrate and the heat sink layer disposed on the electrode pattern. Accordingly, the LED chip 14 is directly mounted on the DCB substrate 11, so that the height of the luminescence device can be reduced.

Further, the luminescence device includes the phosphor 16 disposed on the LED chip 14, thereby reducing the area of the luminescence device and improving the luminance of the luminescence device.

Moreover, the luminescence device includes the reflection preventing glass 19, thereby suppressing the light diffusion and reducing the light emitting area.

That is to say, referring to FIG. 6 and the following table 1, in the comparison of the luminescence device with Edison, the height, outer diameter, effective diameter, field angle, etc., are reduced from 44.2 mm to 22 mm, 87 mm to 60 mm, 70 mm to 44 mm and 60° to 58° respectively. Here, the luminescence device includes, as shown in FIG. 6, a lens. Inner and outer diameters of the inner surface of the lens are 23.24 mm and 23.85 mm respectively.

TABLE 1

|  | Edison | embodiment |
|---|---|---|
| light emitting area of COB (mm) | 23 | 11.8 |
| height (mm) | 44.2 | 22 |
| outer diameter (mm) | 87 | 60 |
| effective diameter (mm) | 70 | 44 |
| field angle (°) | 60 (medium angle) | 58 (medium angle) |
| beam angle (°) |  | 33 |
| geometrical efficiency |  | 96.4 |

Moreover, the luminescence device uses Au as the metal layer of the substrate, to thereby restraining the emitted light from being discolored. The luminescence device is hereby able to inhibit the degradation of luminous flux. That is, since the luminescence device includes the phosphor 16 disposed on the LED chip 14 and the reflection preventing glass 19 disposed spaced from the phosphor 16, little light reaches the first and the second electrode patterns 12 and 13, and thus, Au with a low reflectance can be used as the metal layer of the substrate.

Moreover, in the luminescence device, the metal film 35 is disposed to fill the void 31 which has been positioned in the surface of the first electrode pattern 12, on which the LED chip 14 is mounted, and in the surface of the second electrode pattern 13, to which the bonding wire 17 connected to the electrode pattern 15 is bonded. Accordingly, it is possible to improve the mounting force between the first electrode pattern 12 and the LED chip 14 and to improve the bonding force between the second electrode pattern 13 and the bonding wire 17.

One embodiment is a luminescence device. The luminescence device includes a substrate including a first electrode and a second electrode; an LED chip disposed on the first electrode; and a dam disposed on the substrate, wherein the dam is disposed spaced from the LED chip, wherein the substrate comprises a direct copper bonding (DCB) substrate including a first copper layer and a second copper layer, and wherein the first electrode and the second electrode include respectively a metal film which fills a void of the surfaces thereof.

Another embodiment is a luminescence device. The luminescence device includes a substrate including a first electrode and a second electrode; an LED chip disposed on the first electrode; a bonding wire connects the LED chip with the second electrode; a dam disposed on the substrate; and a reflection preventing glass disposed above the first and the second electrode, wherein the first electrode and the second electrode include respectively a metal film which fills a void of the surfaces thereof, and a height of the dam is greater than a height of the LED chip.

Further another embodiment is a luminescence device. The luminescence device includes a substrate including a first electrode and a second electrode; an LED chip disposed on the first electrode and includes phosphor disposed thereon; a dam disposed on the substrate; and a film disposed on the substrate and the dam and disposed spaced from the LED chip, wherein the substrate comprises a direct copper bonding (DCB) substrate which includes a first copper layer and a second copper layer and, and wherein the first electrode and the second electrode include respectively a metal film which fills a void of the surfaces thereof, and the film comprises at least one of Au and Ag.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A luminescence device comprising:
   a direct copper bonding (DCB) substrate including a substrate body and a first copper layer disposed on the substrate body, wherein the first copper layer includes a first electrode and a second electrode separated from each other;
   a first metal film disposed on the first electrode and filling a void of a surface of the first electrode; and
   an LED chip disposed on the first metal film.

2. The luminescence device of claim 1, wherein a metal paste is applied on the surface in which the void has been positioned, and the metal paste is dried, fired and flattened to form the first metal film.

3. The luminescence device of claim 2, wherein the first metal film comprises at least one of Au and Ag.

4. The luminescence device of claim 1, wherein the LED chip and the first metal film are bonded to each other by an adhesive.

5. The luminescence device of claim 4, wherein the adhesive comprises AuSn.

6. The luminescence device of claim 1, wherein the LED chip comprises an electrode pad, wherein the luminescence device further comprises: a second metal film disposed on the second electrode and filling a void of a surface of the second electrode; and a bonding wire connecting the electrode pad of the LED chip with the second metal film.

7. The luminescence device of claim 1, further comprising a phosphor which excites light emitted from the LED chip, wherein the phosphor is disposed on the LED chip.

8. The luminescence device of claim 7, wherein the phosphor comprises at least one of selected from the group consisting of a silicate based phosphor, a sulfide based phosphor, a YAG based phosphor, a TAG based phosphor and a nitride based phosphor.

9. The luminescence device of claim 1, wherein the dam is an insulation material.

10. The luminescence device of claim 1, wherein a height of the dam is greater than a height of the LED chip.

11. The luminescence device of claim 1, further comprising an encapsulation layer formed on the first and the second electrode.

12. The luminescence device of claim 11, wherein the encapsulation layer is a light-transmitting protective resin.

13. The luminescence device of claim 1, further comprising a reflection preventing glass disposed above the first and the second electrode.

14. The luminescence device of claim 13, wherein the reflection preventing glass which is parallel with the substrate.

15. The luminescence device of claim 1, further comprising an anti-corrosion layer disposed on a surface of the first copper layer.

16. The luminescence device of claim 1, wherein the direct copper bonding substrate comprises a second copper layer disposed under the substrate body.

17. A luminescence device comprising:
   a substrate including a first electrode and a second electrode;
   a first metal film disposed on the first electrode and filling a void of a surface of the first electrode;
   an LED chip disposed on the first metal film and comprising an electrode pad;
   a bonding wire connecting the electrode pad of the LED chip with the second electrode;
   a dam disposed on the substrate; and
   a reflection preventing glass disposed above the first and the second electrode,
   wherein a height of the dam is greater than a height of the LED chip.

18. The luminescence device of claim 17, wherein the LED includes phosphor disposed thereon.

19. A luminescence device comprising:
   a substrate including a first electrode and a second electrode;
   a first metal film disposed on the first electrode and filling a void of a surface of the first electrode;
   an LED chip disposed on the first metal film and includes phosphor disposed thereon;
   a dam disposed on the substrate; and a film disposed on the substrate and the dam and disposed spaced from the LED chip, wherein the substrate comprises a direct copper bonding (DCB) substrate which includes a first copper layer comprising the first electrode and the second electrode, and wherein the film comprises at least one of Au and Ag.

\* \* \* \* \*